(12) United States Patent
Lin et al.

(10) Patent No.: US 11,776,961 B2
(45) Date of Patent: Oct. 3, 2023

(54) SEMICONDUCTOR DEVICE AND MANUFACTURING METHOD THEREOF FOR SELECTIVELY ETCHING DUMMY FINS

(71) Applicant: Taiwan Semiconductor Manufacturing Co., Ltd., Hsin-Chu (TW)

(72) Inventors: Zhi-Chang Lin, Hsinchu County (TW); Wei-Hao Wu, Hsinchu (TW); Jia-Ni Yu, New Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/568,428

(22) Filed: Jan. 4, 2022

(65) Prior Publication Data

US 2022/0130826 A1    Apr. 28, 2022

Related U.S. Application Data

(62) Division of application No. 16/279,824, filed on Feb. 19, 2019, now Pat. No. 11,217,585.

(Continued)

(51) Int. Cl.
*H01L 27/092* (2006.01)
*H01L 27/02* (2006.01)
(Continued)

(52) U.S. Cl.
CPC .... *H01L 27/0924* (2013.01); *H01L 21/31111* (2013.01); *H01L 21/823821* (2013.01);
(Continued)

(58) Field of Classification Search
CPC ....... H01L 21/31111; H01L 21/823821; H01L 21/823878; H01L 21/823807;
(Continued)

(56) References Cited

U.S. PATENT DOCUMENTS

| 8,772,109 B2 | 7/2014 | Colinge |
| 8,785,285 B2 | 7/2014 | Tsai et al. |
| 8,796,666 B1 | 8/2014 | Huang et al. |
| 8,815,712 B2 | 8/2014 | Wan et al. |

(Continued)

OTHER PUBLICATIONS

Lin, Zhi-Chang et al., "Semiconductor Device and Method Fabricating the Same", U.S. Appl. No. 16/142,672, filed Sep. 26, 2018, 55 pages.

*Primary Examiner* — Lex H Malsawma
*Assistant Examiner* — Eric W Jones
(74) *Attorney, Agent, or Firm* — HAYNES AND BOONE, LLP

(57) ABSTRACT

A semiconductor device includes a first device fin and a second device fin that are each located in a first region of the semiconductor device. The first region has a first pattern density. A first dummy fin is located in the first region. The first dummy fin is disposed between the first device fin and the second device fin. The first dummy fin has a first height. A third device fin and a fourth device fin are each located in a second region of the semiconductor device. The second region has a second pattern density that is greater the first pattern density. A second dummy fin is located in the second region. The second dummy fin is disposed between the third device fin and the fourth device fin. The second dummy fin has a second height that is greater than the first height.

20 Claims, 14 Drawing Sheets

Related U.S. Application Data

(60) Provisional application No. 62/736,054, filed on Sep. 25, 2018.

(51) Int. Cl.
| | | |
|---|---|---|
| *H01L 29/08* | (2006.01) | |
| *H01L 21/8238* | (2006.01) | |
| *H01L 29/66* | (2006.01) | |
| *H01L 21/311* | (2006.01) | |
| *H10B 10/00* | (2023.01) | |

(52) U.S. Cl.
CPC .. *H01L 21/823878* (2013.01); *H01L 27/0207* (2013.01); *H01L 29/0847* (2013.01); *H01L 29/66545* (2013.01); *H10B 10/12* (2023.02); *H10B 10/18* (2023.02); *H01L 21/823807* (2013.01); *H01L 21/823828* (2013.01); *H01L 29/6653* (2013.01); *H01L 29/6656* (2013.01)

(58) Field of Classification Search
CPC ......... H01L 21/823828; H01L 29/0847; H01L 29/66545; H01L 29/6653; H01L 29/6656
USPC ........................................................ 257/369
See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 8,963,258 | B2 | 2/2015 | Yu et al. |
| 9,093,530 | B2 | 7/2015 | Huang et al. |
| 9,105,490 | B2 | 8/2015 | Wang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,236,300 | B2 | 1/2016 | Aw |
| 9,397,006 | B1 | 7/2016 | Ok et al. |
| 9,520,482 | B1 | 12/2016 | Chang et al. |
| 9,548,303 | B2 | 1/2017 | Lee et al. |
| 9,576,814 | B2 | 2/2017 | Wu et al. |
| 9,640,533 | B2 | 5/2017 | Lim et al. |
| 2010/0151640 | A1* | 6/2010 | Huebinger ...... H01L 21/823878 438/283 |
| 2013/0285116 | A1 | 10/2013 | Lochtefeld et al. |
| 2014/0367795 | A1* | 12/2014 | Cai ..................... H01L 29/7851 438/275 |
| 2015/0357439 | A1 | 12/2015 | Liu et al. |
| 2016/0268434 | A1 | 9/2016 | Ching et al. |
| 2017/0125299 | A1 | 5/2017 | Pranatharthiharan et al. |
| 2017/0133286 | A1 | 5/2017 | Sung et al. |
| 2019/0288065 | A1 | 9/2019 | Cho et al. |

\* cited by examiner

SEMICONDUCTOR DEVICE AND MANUFACTURING METHOD THEREOF FOR SELECTIVELY ETCHING DUMMY FINS

PRIORITY DATA

The present application is a divisional application of U.S. application Ser. No. 16/279,824, filed Feb. 19, 2019, which claims benefit of U.S. Provisional Patent Application No. 62/736,054, filed on Sep. 25, 2018, the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, such scaling down has also increased the complexity of processing and manufacturing ICs and, for these advances to be realized. Similar developments in IC processing and manufacturing are needed. For example, a three-dimensional transistor, such as a fin-like field-effect transistor (FinFET), has been introduced to replace a planar transistor. A FinFET can be thought of as a typical planar device extruded into the gate. A typical FinFET is fabricated with a thin "fin" (or fin structure) extending up from a substrate. The channel of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of ways, and in some applications, FinFETs provide reduced short channel effects, reduced leakage, and higher current flow. In other words, they may be faster, smaller, and more efficient than planar devices.

Despite the advantages, existing FinFET devices may still have certain issues. For example, dielectric structures such as dummy fins may be formed to tune an overall fin pattern density, reinforce the mechanical strength of the device fins, and/or enhance the manufacturing capability. However, these dummy fins may also interfere with the lateral growth of source/drain epitaxial layers. As a result, the source/drain epitaxial layers may have smaller sizes, smaller surface areas for silicides, and/or smaller landing window for the conductive contacts to be formed thereon. This may be undesirable in regions of an IC where the spacing between adjacent transistors is relatively large (e.g., in a logic device region). On the other hand, if the dummy fins are vertically shortened so as to not interfere with the lateral growth of the source/drain epitaxial layers, one potential downside is that the source/drain epitaxial layers from adjacent transistors may merge together, if the spacing between adjacent transistors is relatively small (e.g., in a memory device region). Undesirably, this could cause electrical shorting between transistors.

Therefore, while existing FinFET devices and the fabrication thereof have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
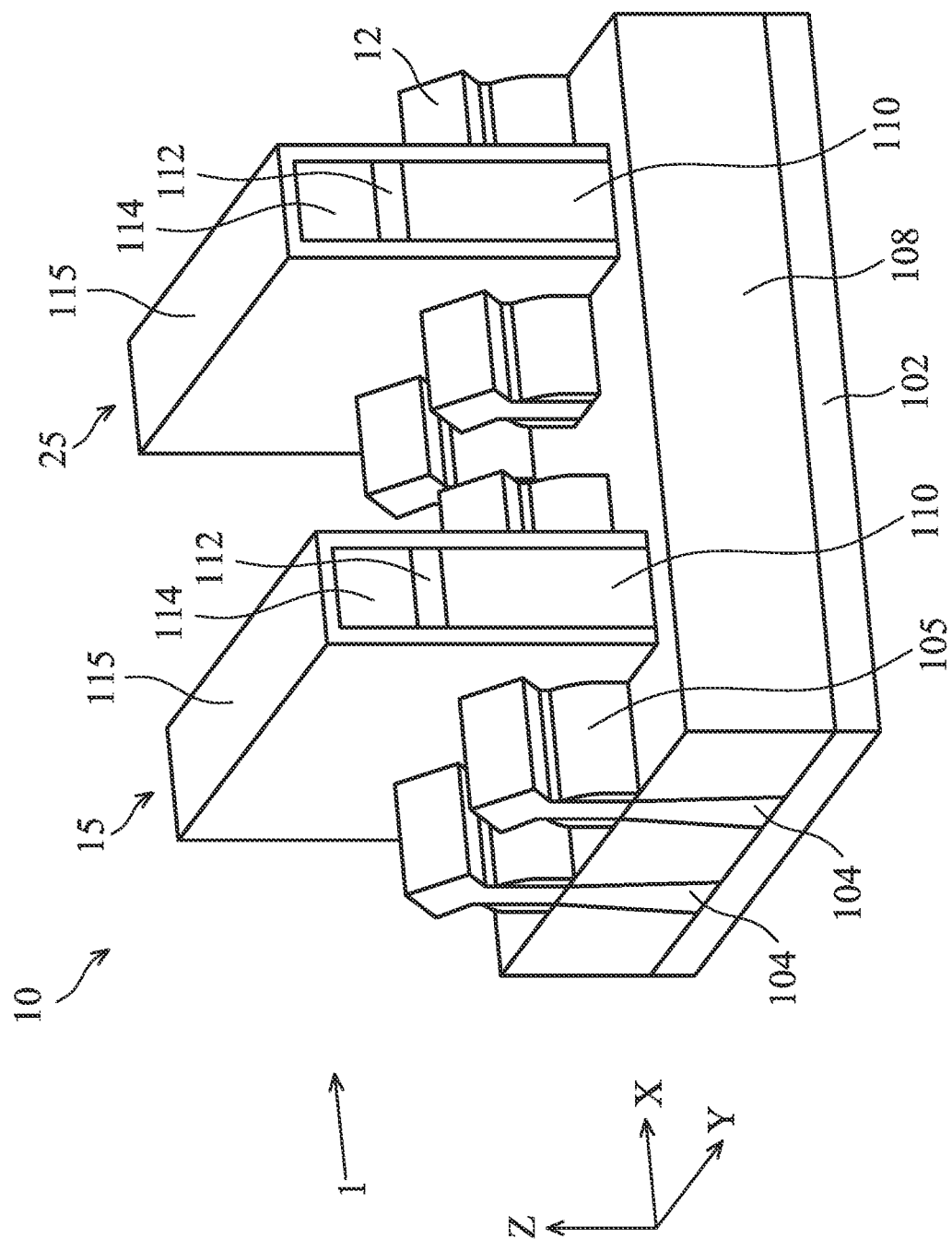
FIG. 1 is a perspective view of an example FinFET transistor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The semiconductor industry has progressed into nanometer technology process nodes in pursuit of higher device density, higher performance, and lower costs. To realize these improvements, the use of FinFET devices has been gaining popularity in the semiconductor industry.

The present disclosure is directed to, but not otherwise limited to, a method of recessing a dummy fin in select regions of a wafer in order to simultaneously optimize performance and reduce transistor bridging/shorting concerns. To illustrate the various aspects of the present disclosure, a FinFET fabrication process is discussed below as an example. In that regard, a FinFET device is a fin-like field-effect transistor device, which has been gaining popularity in the semiconductor industry. The FinFET device may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure, but it is understood that the application is not limited to the FinFET device, except as specifically claimed.

Referring to FIG. 1, a perspective view of an example FinFET device 10 is illustrated. The FinFET device structure 10 includes an N-type FinFET device structure (NMOS) 15 and a P-type FinFET device structure (PMOS) 25. The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device structure 10 also includes one or more fin structures 104 (e.g., Si fins) that extend from the substrate 102 in the Z-direction and surrounded by spacers 105 in the Y-direction. The fin structure 104 is elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a multiple patterning lithography process, such as a double-patterning lithography (DPL) process. DPL is a method of constructing a pattern on a substrate by dividing the pattern into two interleaved patterns. DPL allows enhanced feature (e.g., fin) density. The fin structure 104 also includes an epi-grown material 12, which may (along with portions of the fin structure 104) serve as the source/drain of the FinFET device structure 10.

An isolation structure 108, such as a shallow trench isolation (STI) structure, is formed to surround the fin structure 104. In some embodiments, a lower portion of the fin structure 104 is surrounded by a isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110. A dielectric layer 115 may also be formed on the sidewalls of the gate electrode 110 and over the hard mask layers 112 and 114. In at least one embodiment, the dielectric layer 115 is directly in contact with the gate electrode 110.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, there may still be areas in which conventional FinFET fabrication may be improved. For example, FinFET device fabrication may involve forming a dielectric structure such as a dummy fin (also referred to as a hybrid fin) in order to tune an overall fin pattern density, reinforce the mechanical strength of the device fins, and/or enhance the manufacturing capability. However, an IC chip may include different types of devices with different functionalities, designs, and/or concerns, which have not been simultaneously met by the dielectric structure. For example, an IC chip may include logic devices, such as core and input/output (I/O) devices, as well as memory devices such as Static Random Access Memory (SRAM) devices. Compared to SRAM devices, logic devices and I/O devices may need to have larger source/drain epi-layers in order to optimize performance and/or handle the input/out signals. However, when the dielectric structures such as dummy fins are formed between the source/drain epi-layers, they may restrict the lateral epitaxial growth of the source/drain epi-layers. When this occurs, the reduced size of the source/drain epi-layers may adversely impact the performance of the logic or I/O devices. In addition, the restricted lateral growth of the source/drain epi-layers may also result in a reduced silicide area, as well as a smaller landing area for the conductive contacts to be formed thereon. For these reasons, it may be beneficial to reduce the height of the dielectric structures, so that the lateral growth of the source/drain epi-layers for the logic devices or I/O devices is not constrained.

In comparison to the logic devices or I/O devices, SRAM devices may be smaller and may place a higher consideration on density. In other words, it is desirable to implement a large number of SRAM transistors within a given unit area. As such, the presence of the dummy structures typically does not pose a problem, since the lateral growth of the source/drain epi-layers of the SRAM transistors is not as important as it is for the logic devices or I/O devices. However, if the height of the dielectric structures is reduced, then bridging concerns may arise. Stated differently, the source/drain epi-layers from adjacent transistors may grow into each other. This may cause electrical shorting between the adjacent transistors, which could adversely affect the operation of the SRAM device. Note that the bridging concerns (if the dummy structures are removed or recessed) may apply to other non-SRAM devices that also need a tighter layout. For example, for some logic devices, pattern density is a greater priority than performance (e.g., speed or power). Therefore, bridging may be a concern for these types of logic devices too.

Figure 5:
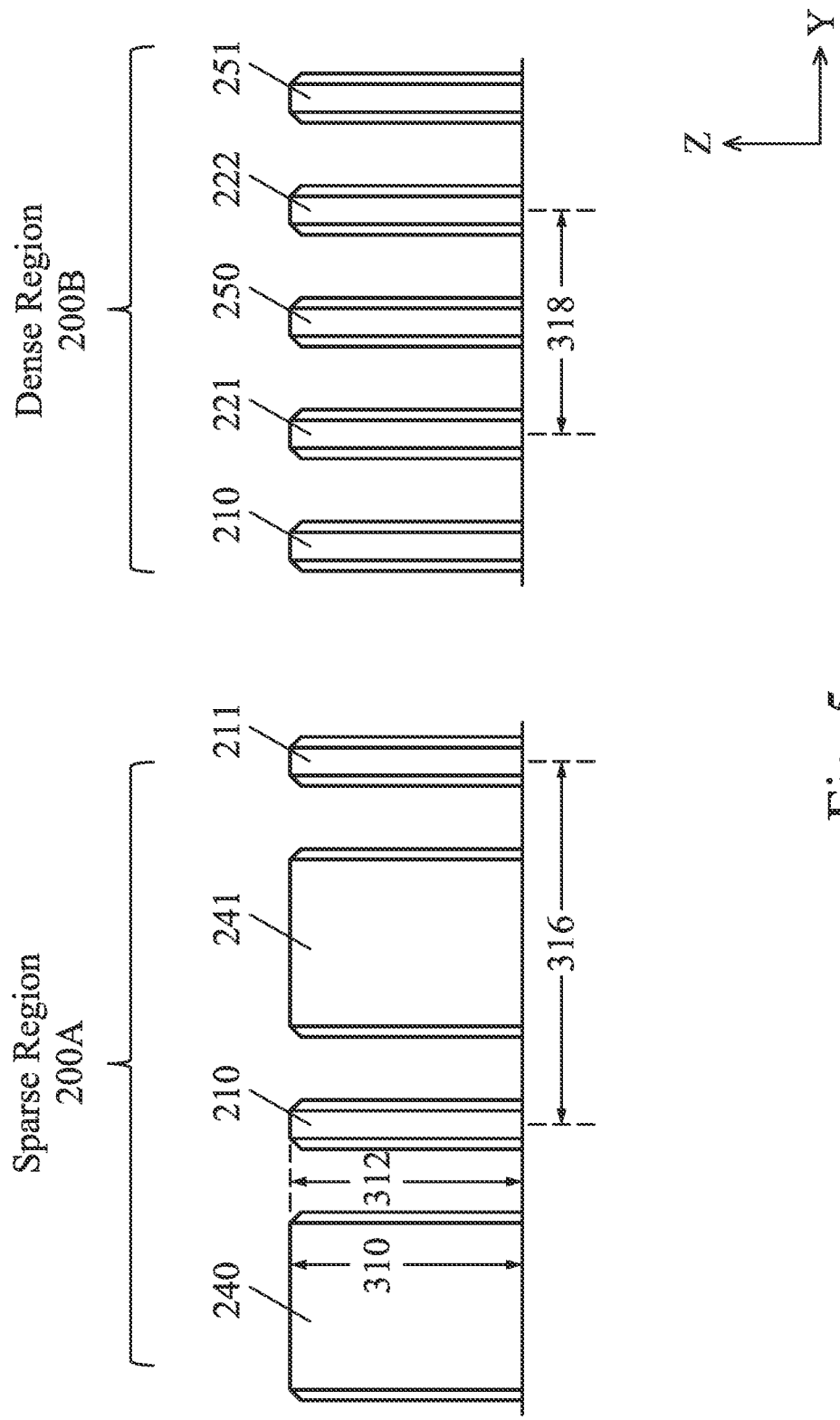
FIGS. 5-6 and 9 illustrate cross-sectional side views of a semiconductor device at various stages of fabrication according to embodiments of the present disclosure.
Figure 6:
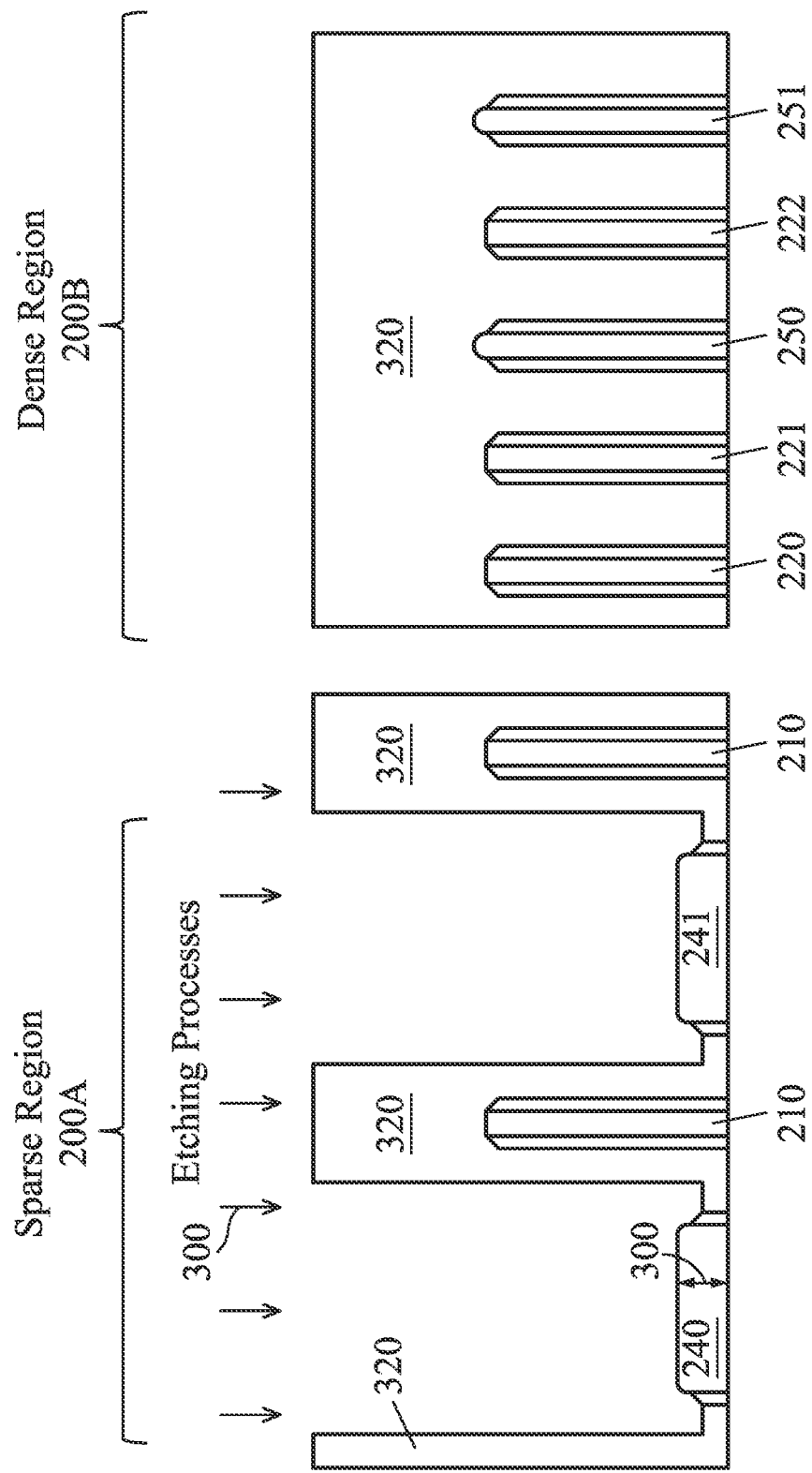

To overcome the problems discussed above, the present disclosure selectively recesses the dummy structures (e.g., by etching) on a wafer, for example in the regions corresponding to the logic devices and/or the I/O devices, but not in the regions corresponding to the SRAM devices (or other devices that need a tighter layout). In this manner, the height of the dielectric structures is reduced more greatly for the logic or I/O devices in order for the source/drain epi-layers to have optimal lateral growth, while the height of the dielectric structures is not substantially reduced for the SRAM devices (or other high-layout-density devices) that use the dielectric structures to prevent bridging. As a result, the respectively priorities/objectives for the logic or I/O devices and the SRAM devices can be achieved simultaneously. The various aspects of the present disclosure will now be discussed below in more detail with reference to FIGS. 2-14. In that regard, FIGS. 2-4, 7-8, and 10-13 are diagrammatic three-dimensional perspective views of a portion of a semiconductor device 200 at various stages of fabrication, FIGS. 5-6 and 9 are fragmentary cross-sectional side views of the semiconductor device 200 at various stages of fabrication, and FIG. 14 is a flowchart illustrating a method of fabricating the semiconductor device 200.

Figure 2:
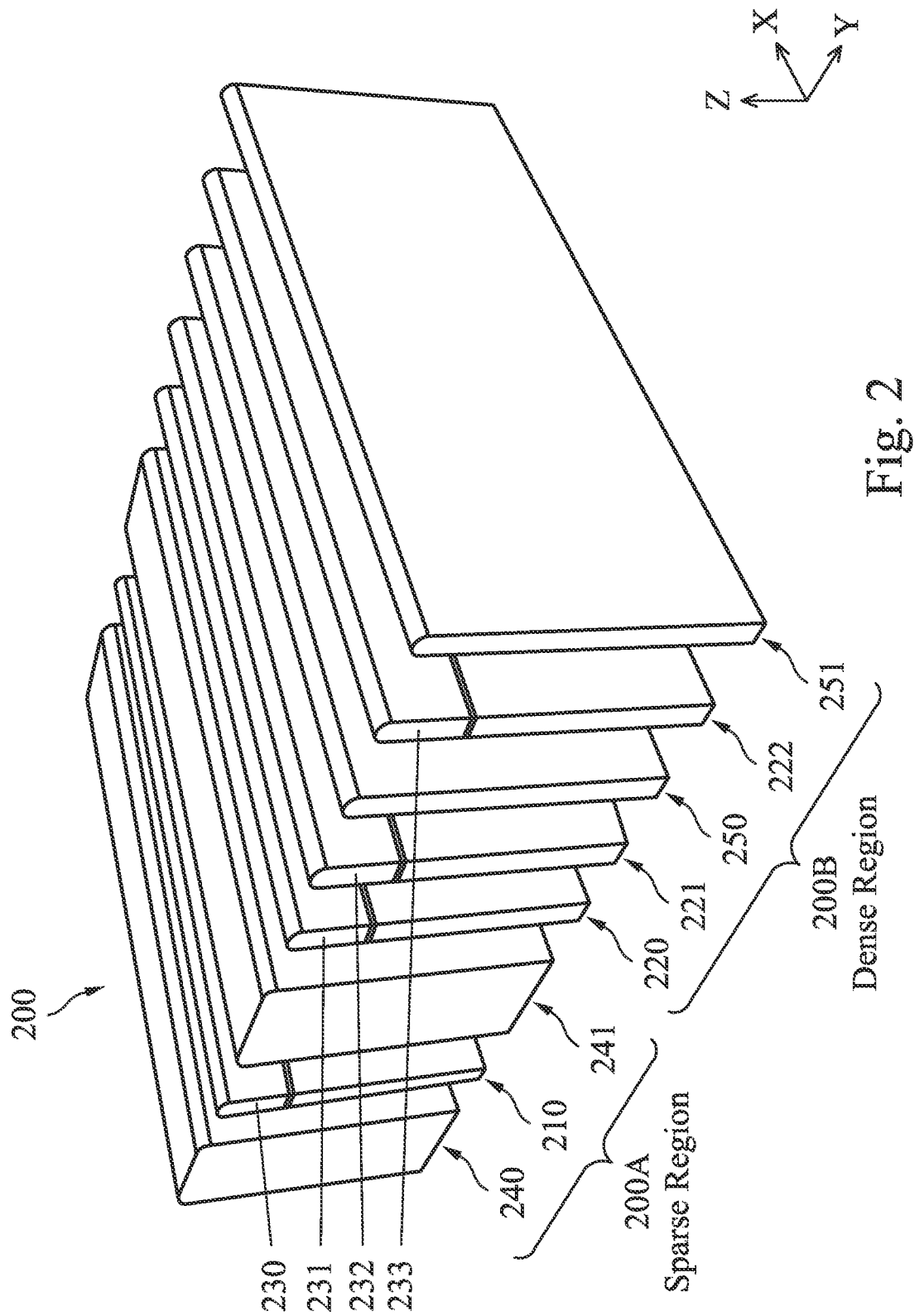
FIGS. 2-4, 7-8, and 10-13 illustrate three-dimensional perspective views of a semiconductor device at various stages of fabrication according to embodiments of the present disclosure.

Referring now to FIG. 2, the semiconductor device includes a substrate (not specifically illustrated herein for reasons of simplicity). The substrate may include a bulk silicon substrate in some embodiments. In other embodiments, the substrate may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. In further embodiments, the substrate may include a silicon-on-insulator (SOI) substrate. SOI substrates are fabricated using separation by implantation of oxygen, wafer bonding, and/or other suitable methods. The substrate may also include various isolation features, such as shallow trench isolation (STI) features and active regions defined by the STI features.

The semiconductor device 200 includes regions with varying degrees of layout density. For example, FIG. 2 illustrates a region 200A and a region 200B of the semiconductor device 200. The region 200A may correspond to logic devices and/or I/O devices, where the layout density is lower, and spacing between adjacent transistor components may be wide (e.g., wider than in the region 200B). Conversely, the region 200B may correspond to SRAM devices and/or other logic devices where the layout density is higher, for example higher than the devices in the region 200A. The spacing between adjacent transistor components in the region 200B may be smaller than in the region 200A. The region 200A may hereinafter be referred to as a sparse region, and the region 200B may hereinafter be referred to as a dense region. In some embodiments, the pattern density of the dense region 200B is at least twice as high as the pattern density of the sparse region 200A (e.g., at least twice the number of transistors per unit area).

Both the region 200A and 200B include active regions. In some embodiments, the active regions may vertically protrude above the isolation features with a non-planar structure, such as fin structures 210 and 220-222 in FIG. 2. The fin structures 210 and 220-222 extend horizontally in the X-direction and protrude vertically upwards in the Z-direction that is orthogonal to a horizontal plane defined by the X-direction and Y-direction. The fin structures 210 and 220-222 may serve as the active regions of FinFET devices. For ease of reference, the fin structures 210 and 220-222 may be interchangeably referred to as device fins hereinafter, to be differentiated from the dummy fins discussed below. The device fins 210 and 220-222 may be patterned by hard masks 230-233, respectively. The hard masks 230-233 may include a dielectric material. The device fins 210 and 220-222 may include a semiconductor material such as silicon (Si) or silicon germanium (SiGe), or a III-V group compound such as gallium arsenide (GaAs), indium gallium arsenide (InGaAs), indium phosphide (InP), etc.

The semiconductor device 200 also includes dielectric structures 240-241 and 250-251. These dielectric structures 240-241 and 250-251 may also be referred to as dummy fins or hybrid fins hereinafter. The dummy fins 240-241 and 250-251 also extend horizontally in the X-direction and protrude vertically upwards in the Z-direction. The dummy fins 240-241 and 250-251 may be interspersed among the device fins 210 and 220-222. As discussed above, the dummy fins help to tune an overall fin pattern density, reinforce the mechanical strength of the device fins, and/or enhance the manufacturing capability. In some embodiments, the dummy fins 240-241 and 250-251 may contain one or more dielectric materials such as a high-k dielectric material, for example silicon oxynitride (SiON), silicon oxy-carbon nitride (SiOCN), silicon oxycarbide (SiOC), hafnium oxide (HfO$_2$) or zirconium oxide (ZrO$_2$), aluminum oxide (AlO$_2$), or combinations thereof.

At this stage of fabrication, the dummy fins 240-241 and 250-251 and the device fins 210 and 220-222 have substantially similar fin heights in the Z-direction (e.g., within a few percentage points of one another), where the height of the mask layers 230-233 is included as a part of the fin height of the device fins. The dummy fins 240-241 also each have a substantially greater lateral dimension in the Y-direction than the dummy fins 250-251 or the device fins 210 and 220-222 (e.g., at least twice as wide). The vertical and horizontal dimensions of the dummy fins 240-241 and 250-251 are configured to optimize their functionalities in terms of tuning the overall fin pattern density or reinforcing mechanical strength of the device fins 210 and 220-222, etc.

Note that the device fin 210 and the dummy fins 240-241 are located in the sparse region 200A, and the device fins 220-222 and the dummy fins 250-251 are located in the dense region 200B. Due to the pattern density differences between the sparse region 200A and the dense region 200B, the fabrication processing performed to them will be different according to embodiments of the present disclosure. For example, the height of the dummy fins 240-241 may be reduced (e.g., via one or more etching processes) more greatly than the height of the dummy fins 250-251.

Figure 3:
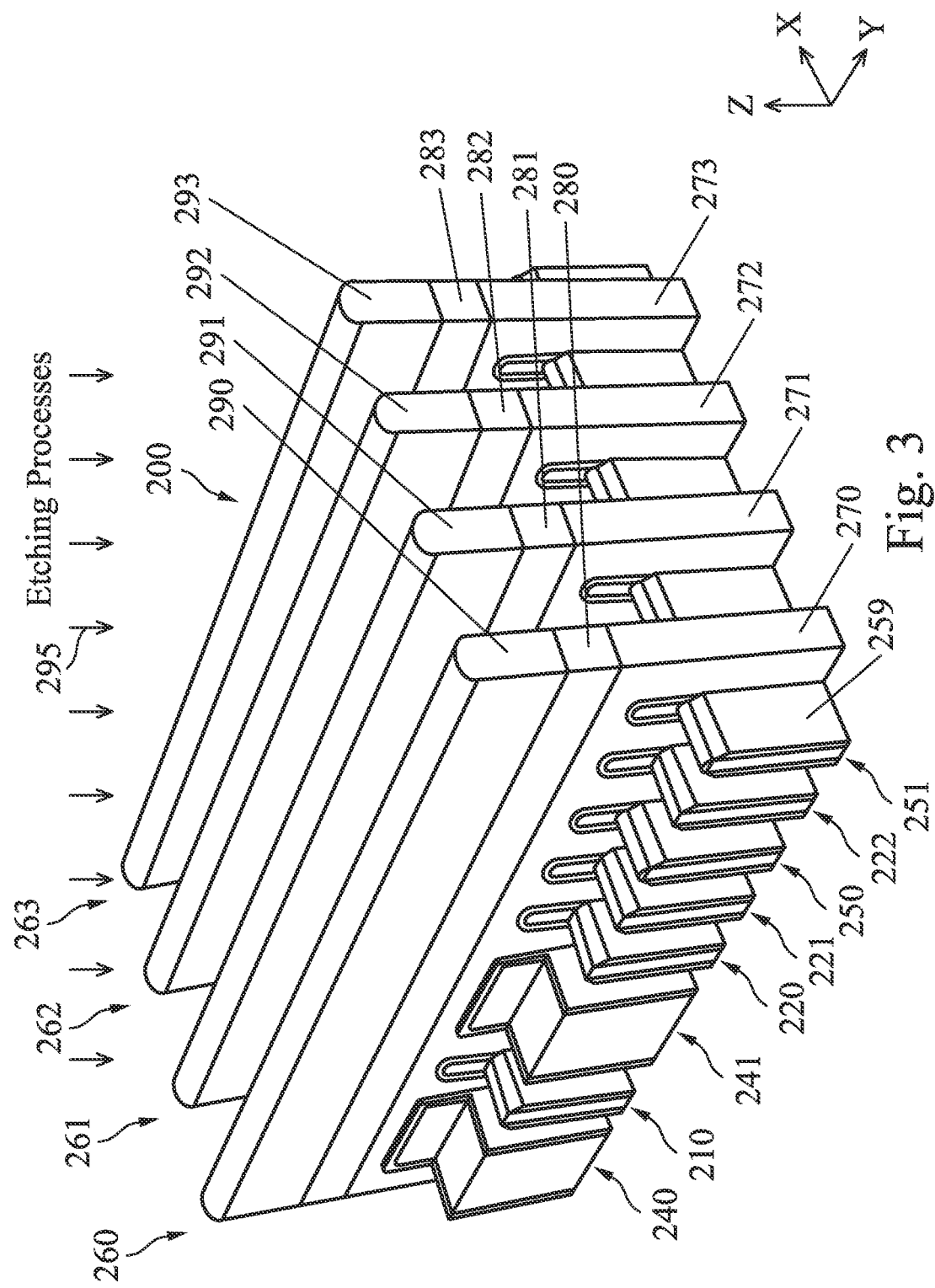

Referring now to FIG. 3, spacers 259 may be formed on each of the device fins 210 and 220-222 and the dummy fins 240-241 and 250-251. The spacers 259 may include a dielectric material such as a low-k dielectric material, silicon oxide, silicon nitride, etc. The spacers 259 may be viewed as a part of the dummy fins 240-241 and 250-251 in some embodiments.

The gate structures 260- 263 are then formed over the device fins 210 and 220-222 and the dummy fins 240-241 and 250-251. The gate structures 260-263 each extend horizontally in the Y-direction and extend vertically upwards in the Z-direction. The gate structures 260-263 each partially wrap around the top and side surfaces of the device fins 210 and 220-222 as well as the dummy fins 240-241 and 250-251. The portions of the device fins 210 and 220-222 located directly underneath the gate structures 260-263 may serve as the channel regions of the transistors. The gate structures 260-263 may include gate electrodes 270-273, respectively. In some embodiments, the gate electrodes 270-273 may be dummy gate electrodes, for example dummy polysilicon electrodes. These dummy gate electrodes 270-273 may be removed and replaced by metal gate electrodes in a gate replacement process later. The gate structures 260-263 also include mask layers 280-283 and 290-293 disposed over the gate electrodes 270-273. The mask layers 280-283 and 290-293 may be used to pattern a material layer (e.g., a polysilicon layer) to define the gate electrodes 270-273. It is understood that the gate structures 260-263 also include gate dielectrics, such as a high-k (e.g., a dielectric constant greater than about 4) gate dielectric. The gate dielectrics may be located below the gate electrodes 270-273 and are not specifically illustrated herein for reasons of simplicity.

After the formation of the gate structures 260-263, one or more etching processes 295 may be performed to partially remove the hard masks 230-233 disposed over the device fins 210 and 220-222, until the device fins 210 and 220-222 are exposed. As shown in FIG. 3, upper portions of the dummy fins 240-241 and 250-251, as well as the upper portions of the spacers 259, may also be removed by the one or more etching processes 295.

Figure 4:
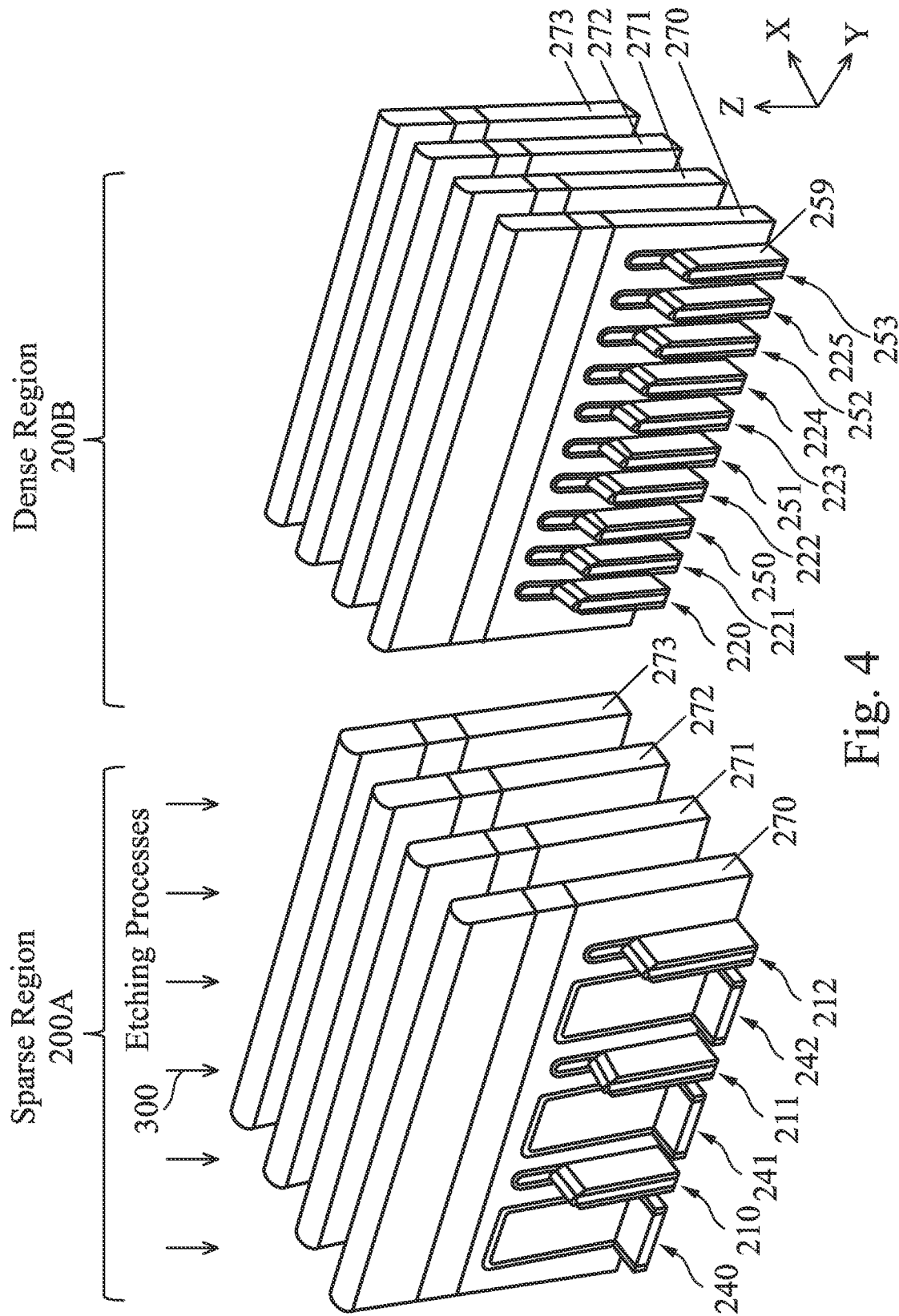

Referring now to FIG. 4, the sparse region 200A and the dense region 200B are illustrated separately to show additional components in each of the regions 200A-200B. For example, the sparse region 200A further includes device fins 211-212 and a dummy fin 242, and the dense region 200B further includes device fins 223-225 and dummy fins 252-253. An etching process 300 is performed to selectively etch the semiconductor device 200 such that the dummy fins 240-242 of the sparse region 200A are recessed, but the dummy fins 250-253 of the dense region 200B are not. For example, a protective layer (e.g., a photoresist mask) may be formed over the dense region 200B and selectively formed over portions of the sparse region 200A other than the dummy fins 240-242. Thus, the components in the dense region 200B (and device fins 210-212 of the sparse region 200A) are protected by the protective layer during the etching processes 300, while the dummy fins 240-242 in the sparse region 200A are exposed to the etching.

As can be seen from FIG. 4, the partial removal of the dummy fins 240-242 "opens up" space between the device fins 210-212, and therefore a subsequent lateral epitaxial growth from the device fins 210-212 will not be unduly impeded. Meanwhile, since the dummy fins 250-253 are not affected by the etching processes 300, the dummy fins 250-253 can still serve as isolation structures to prevent undesirable bridging between the adjacent transistors in the dense region.

FIGS. 5-6 are fragmentary cross-sectional side views of portions of the sparse region 200A and the dense region 200B to further illustrate the aspect of the present disclosure involving the selective recessing of the dummy fins 240-242 in the sparse region 200A. The cross-sectional side views are taken along a plane defined in the Z-direction and the Y-direction of FIG. 4.

The stage of fabrication shown in FIG. 5 may correspond to the stage of fabrication shown in FIG. 3. That is, although the dummy fins 240-241 in the sparse region 200A and the dummy fins 250-251 in the dense region have both been partially etched by the etching processes 295 to "open up" the device fins 210-211 and 220-222 (e.g., by removing the hard mask layers formed thereon), the dummy fins 240-241 in the sparse region 200A have not been selectively etched to significantly reduce their height yet. In other words, the etching processes 300 discussed above have not been performed at this stage of fabrication yet.

The dummy fins 240-241 may have a height 310 (measured in the Z-direction) at this stage of fabrication. In some embodiments, the height 310 is in a range between about 25 nanometers (nm) and about 105 nm. The device fins 210-211 may have a height 312 that is not too different from the height 310. For example, the height 312 may be within a few percentage nanometers (either greater or smaller) of the height 310. In some embodiments, the height 312 is in a range between about 30 nm and about 100 nm. The heights 310 and 312 are configured such that the dummy fins serve their purposes such as providing sufficient mechanical strength, whereas the device fins may have a sufficient amount of height to facilitate the subsequent epitaxial growth of source/drain epi-layers.

The pattern density difference between the sparse region 200A and the dense region 200B is also clearly illustrated in FIG. 5. For example, the sparse region 200A may have a fin-to-fin spacing that is represented by a distance 316 (measured in the Y-direction), whereas the dense region 200B may have a fin-to-fin spacing that is represented by a distance 318 (also measured in the Y-direction). The fin-to-fin spacing in each region 200A or 200B is measured from a center of one device fin to a center of the nearest adjacent device fin, where at least one dummy fin is located between the adjacent device fins. As examples, the distance 316 is measured as the distance between the device fins 210 and 211, whereas the distance 318 is measured as the distance between the device fins 221 and 222. As shown in FIG. 5, the distance 316 is substantially greater than the distance 318. For example, the distance 316 is at least twice as long as the distance 318. In some embodiments, the distance 316 exceeds the distance 318 by at least 40 nm. Due to the relatively wide spacing in the sparse region 200A (e.g., manifested by the difference in value between the distance 316 and 318), the epi-layers to be grown on the device fins 210-211 are unlikely to bridge with one another, even if the height 310 of the dummy fins 240-241 is reduced. In comparison, if the dummy fins 250-251 in the dense region 200B have a reduced height, the epi-layers to be grown on the device fins 221-222 may bridge with one another. As such, the present disclosure substantially reduces the height of the dummy fins 240-241 in the sparse region 200A, but not in the dense region 200B.

Referring now to FIG. 6, the one or more etching processes 300 (discussed above with reference to FIG. 4) are performed. As discussed above, a protective layer 320 may be formed to cover up the components in the dense region 200B, as well as over the device fins 210-211 in the sparse region 200A. The protective layer 320 may be a photoresist layer in some embodiments, but it may also be another hard mask layer in other embodiments. The etching processes 300 reduce the height of the dummy fins 240-241 from a height of 310 down to a height 330.

In some embodiments, the height 330 is at least about 20 nm than the height 310 of the dummy fins 240-241 prior to being etched. For example, the height 330 may be in a range between about 5 nm and about 70 nm. In some embodiments, a ratio of the fin height 330 and the fin height 310 is in a range between about 1:20 and 1:1.1. These ranges are configured such that the height 330 is configured to be sufficiently small such that it no longer poses a problem of restricting the lateral growth of the source/drain epi-layers to be formed later, while at the same time, the height 330 is configured to be not too small, so that the dummy fins 240-241 can still adequately serve their original purposes of tuning the overall fin pattern density, reinforcing the mechanical strength of the device fins, etc.

Figure 7:
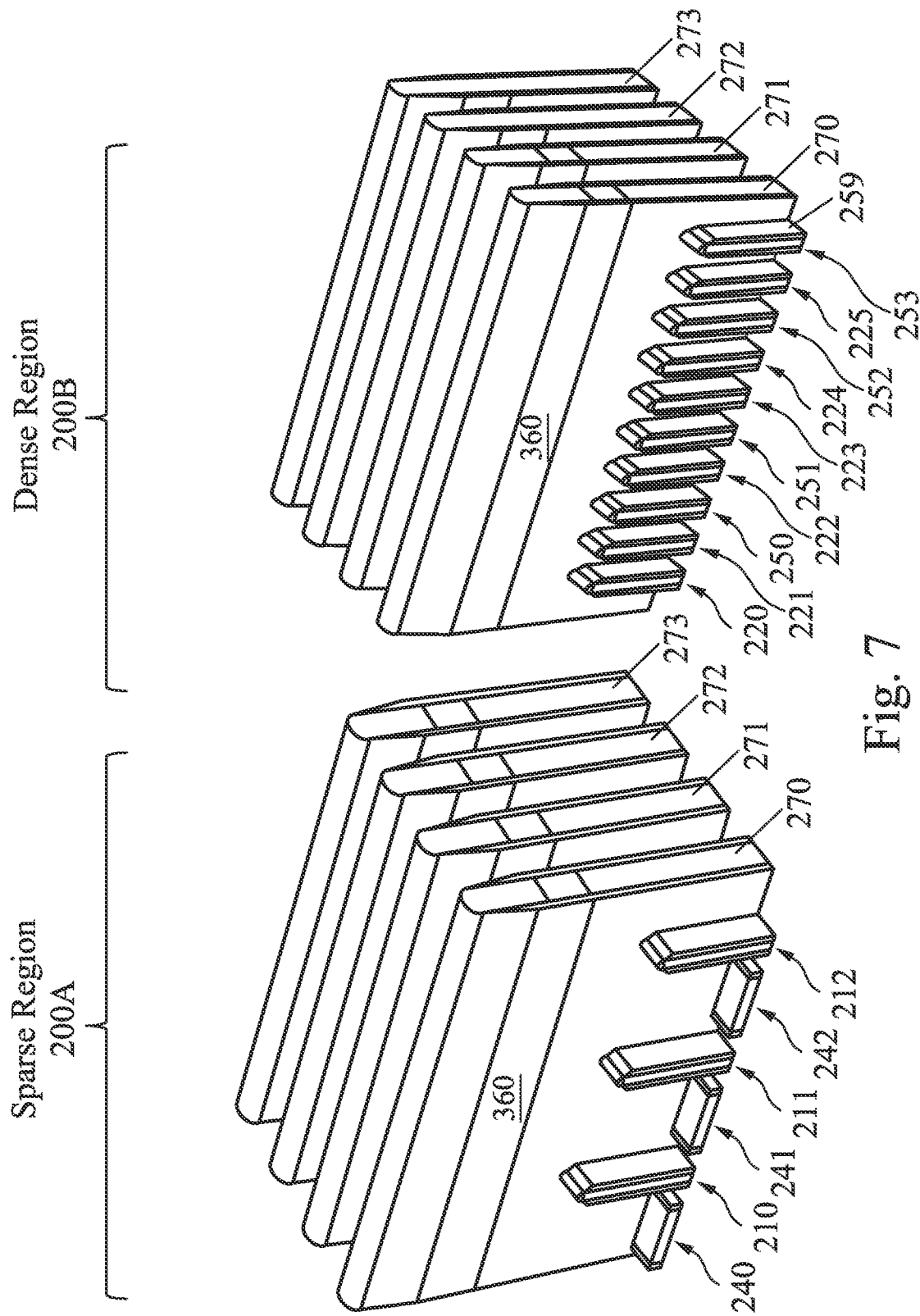

Referring now to the three-dimension perspective view of FIG. 7, sealing spacers 360 may be formed on the side surfaces of the gate structures 270-273 in both the sparse region 200A and the dense region 200B. The sealing spacers 360 may include a dielectric material composition and may be formed by depositing the dielectric material and subsequently performing one or more etching processes. Note that the etching processes 300 discussed above need not be performed before the formation of the sealing spacers 360. In some embodiments, the sealing spacers 360 may be formed first, and then the etching processes 300 may be performed to selectively recess the dummy fins 240-242 in the sparse region 200A.

Figure 8:
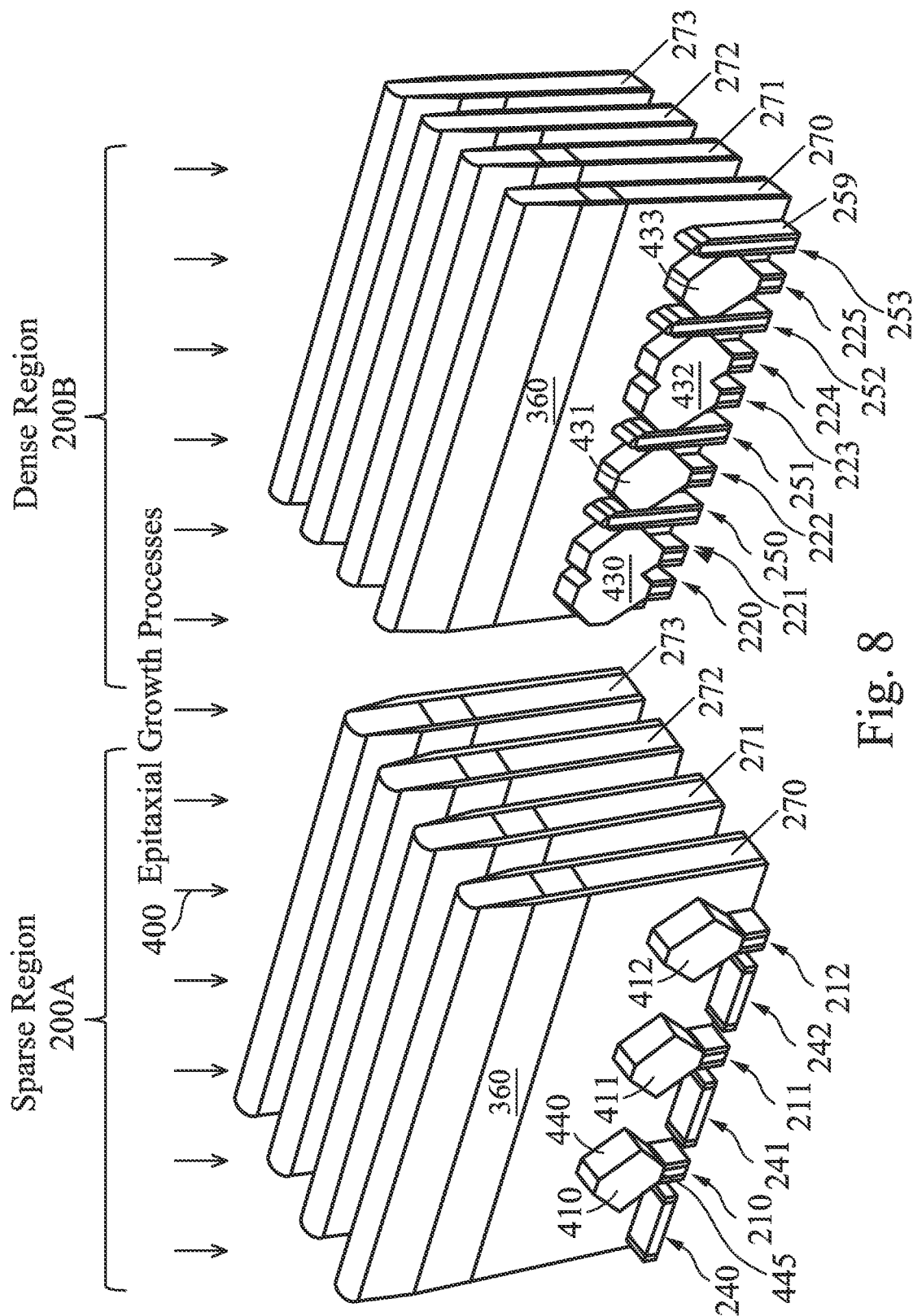
Figure 9:
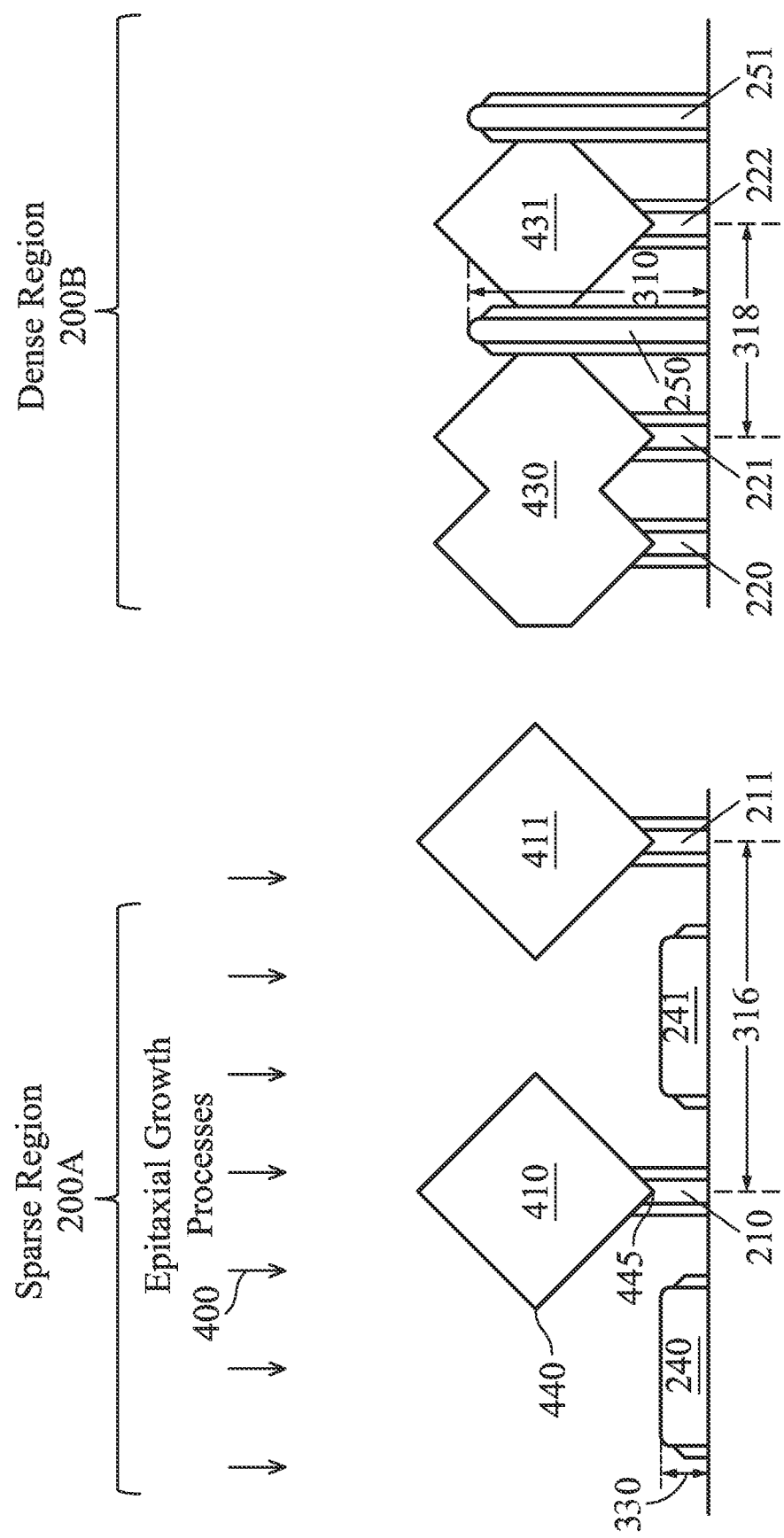

Referring now to the three-dimensional perspective view of FIG. 8 and the cross-sectional side view of FIG. 9, an epitaxial growth process 400 is performed to grow source/drain epi-layers for both the sparse region 200A and the dense region 200B. For example, epi-layers 410-412 may be formed in the sparse region 200A, while epi-layers 430-433 may be formed in the dense region 200B. The epi-layers 410-412 and 430-433 may contain a semiconductive material such as silicon (Si) or silicon phosphorous (SiP) or silicon germanium (SiGe), or a III-V group compound such as gallium arsenide (GaAs), indium gallium arsenide (InGaAs), indium phosphide (InP), etc. The epi-layers 410-412 and 430-433 may serve as the source/drain regions of transistors and may be interchangeably referred to as source/drain epi-layers hereinafter. In some embodiments, the source/drain epi-layers 410-412 are formed by recessing portions of the device fins 210-212 and thereafter growing the source/drain epi-layers 410-412 on the recessed device fins. The source/drain epi-layers 430-433 may be formed similarly on the device fins 220-225. It is understood that the height reduction of the dummy fins 240-241 may occur at fabrication stages other than what is discussed above, as long as it occurs before the epitaxial growth process 400 is performed.

As is shown in FIGS. 8-9, due to the partial removal (and the reduced height) of the dummy fins 240-242 in the sparse region 200A, the lateral growth of the source/drain epi-layers 410-412 is substantially unimpeded. For example, the source/drain epi-layers 410-412 may grow laterally outward and not be stopped by the sidewalls of the dummy fins 240-242. Rather, the upper surfaces of the dummy fins 240-241 are still disposed below an outermost lateral protrusion point 440 of the source/drain epi-layers 410-411. In some embodiments, the upper surfaces of the dummy fins 240-241 may even be disposed below a bottommost point 445 of the source/drain epi-layers 410-411. It is understood that the points 440 and 445 may not necessarily be a point, but may also represent an area/region or a collection of points.

As discussed above, the objectives of the devices in the sparse region 200A include a large size of epi-layers for epi-stress, a large sidewall surface area for reduced silicide resistance, and/or a large landing area/window for the conductive contact to be formed thereon. Thus, present disclosure optimizes the performance of the devices in the sparse region 200A, since the source/drain epi-layers 410-412 are allowed to have unfettered lateral growth, thereby forming large source/drain epi-layers that can satisfy the objectives of the devices in the sparse region 200A.

Meanwhile, the present disclosure does not substantially reduce the height of the dummy fins 250-253 in the region 200B, since the region 200B is protected from the etching processes 300. In some embodiments such as the illustrated embodiment, the source/drain epi-layers 430-433 may grow laterally such that they come into physical contact with the dummy fins 250-253 (note that the spacers 259 may be considered a part of the dummy fins 250-253). Thus, the unreduced height of the dummy fins 250-253 means that they can still adequately help isolate the source/drain epi-layers 430-433 from one another. This helps the devices in the dense region 200B meet one of their objectives, which is to prevent undesirable electrical bridging between transistors, while preserving a high pattern density. In this manner, the embodiments of the present disclosure can simultaneously achieve the different objectives for both the devices in the sparse region 200A and the devices in the dense region 200B. Note that some source/drain epi-layers in the dense region—such as epi-layers 430 and 432—may indeed be formed by merging together the epi-layers from adjacent transistors. However, this is according to the device design and is intentional, rather than undesirable.

Figure 10:
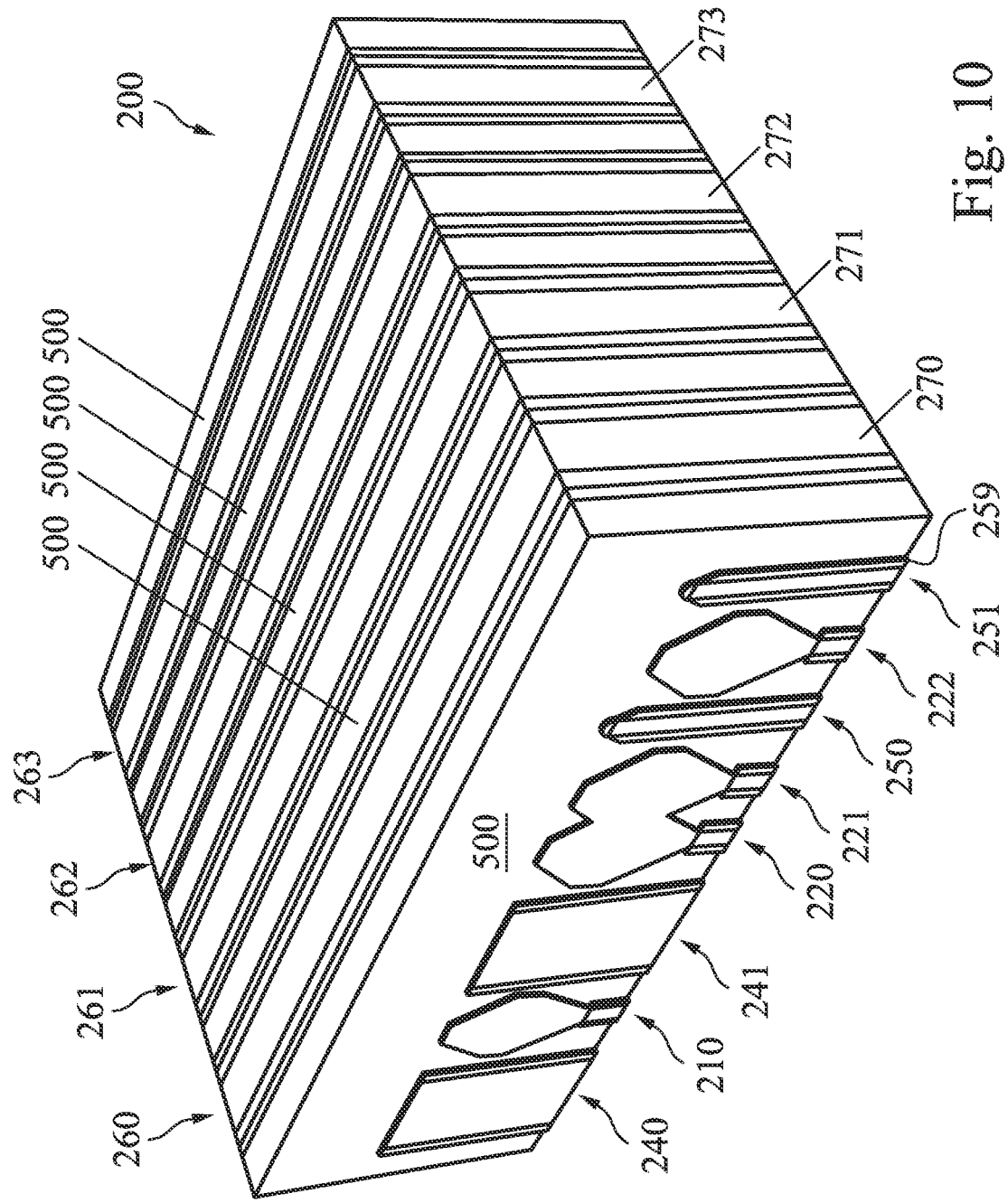

Referring now to FIG. 10, the mask layers 280-283 and 290-293 formed over the gate electrodes 270-273 are removed. Thereafter, an interlayer dielectric (ILD) 500 is formed. The ILD 500 may also be referred to as an ILD0 layer. The ILD 500 may include a dielectric material, such as a low-k dielectric material (a dielectric material with a dielectric constant smaller than that of silicon dioxide). As non-limiting examples, the low-k dielectric material may include fluorine-doped silicon dioxide, carbon-doped silicon dioxide, porous silicon dioxide, porous carbon-doped silicon dioxide, spin-on organic polymeric dielectrics, spin-on silicon based polymeric dielectrics, or combinations thereof. Alternatively, the ILD0 layer may include silicon oxide or silicon nitride, or combinations thereof. Among other things, the ILD 500 provides electrical isolation between the various components of the semiconductor device 200.

Figure 11:
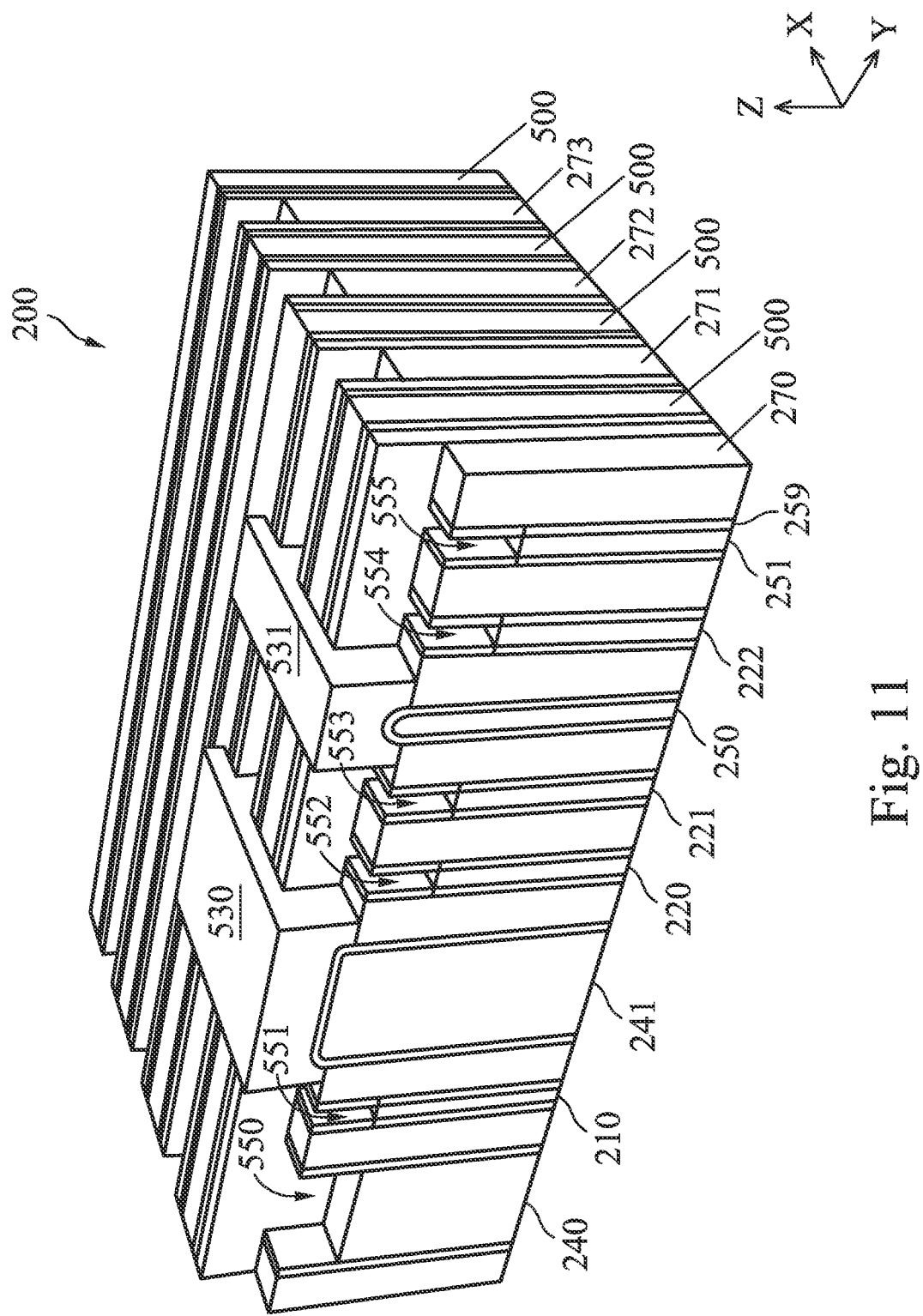

Referring now to FIG. 11, cutting patterns 530 and 531 are formed. The cutting patterns 530-531 may contain a dielectric material suitable for being used as a mask during a patterning process. For example, the cutting pattern 530 is formed over the dummy fin 241 and portions of the gate electrodes 270-271, and the cutting pattern 531 is formed over the dummy fin 250 and portions of the gate electrodes 270-271. One or more etching processes may then be performed to etch away portions of the dummy fins 240 and 251, as well as the device fins 210, 220-222, which are unprotected by the cutting patterns 530-531 and exposed to the etching. The partial removal of the dummy fins 240 and 251 and the device fins 210 and 220-222 results in recesses, such as recesses 550-555 shown in FIG. 11. These recesses will be filled by subsequently formed materials, for example by a metal gate electrode material, in order to establish electrical connectivity between various components of the semiconductor device 200.

Note that the Y-Z plane of the perspective view of FIG. 11 is shown at the cross-section of the gate electrode 270, rather than outside of the gate electrode 270 (as is the case in FIG. 10). As such, the source/drain epi-layers are not visible in FIG. 11.

Figure 12:
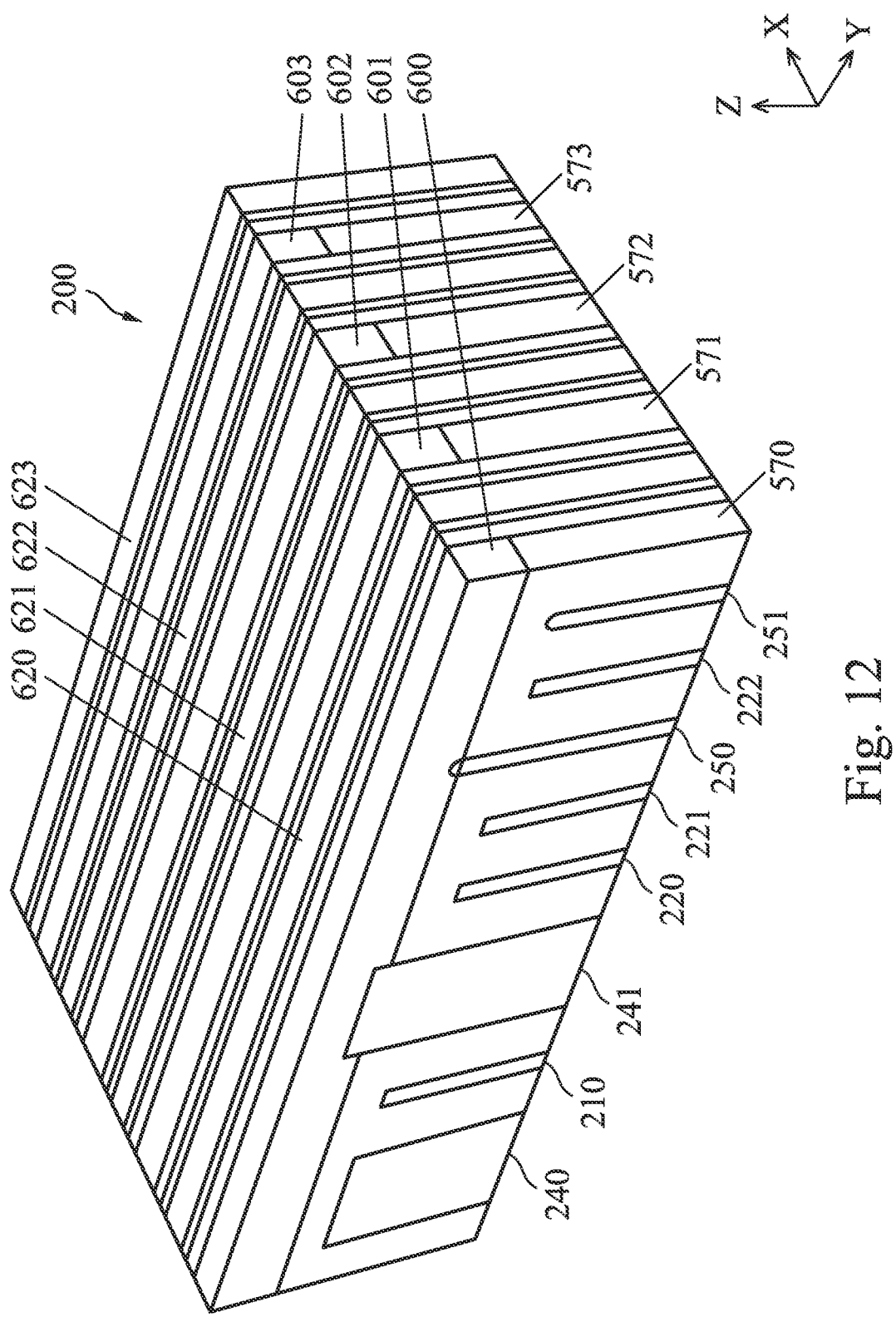

Referring now to FIG. 12, a gate replacement process is performed. In more detail, the gate electrodes 270-273 are removed (e.g., using one or more etching processes) and replaced with metal gate electrodes 570-573, respectively. The metal gate electrodes 570-573 may each include one or more work function metal layers configured to tune a work function of the transistor, as well as one or more fill metal layers configured to serve as a main conductive portion of the metal gate electrode. Note that the metal gate electrodes 570-573 not only replace the dummy gate electrodes but also fill the recesses 550-555 shown in FIG. 11.

Also shown in FIG. 12, layers 600-603 and 620-623 are formed in order to provide electrical isolation for the various components of the semiconductor device 200. In that regard, the layers 600-603 are formed over the gate electrodes 570-573, and layers 620-623 are formed over the source/drain epi-layers 410-412 and 430-433. Similar to FIG. 11, the Y-Z plane of the perspective view in FIG. 11 is also taken at the cross-section of the metal gate electrode 570, and thus the source/drain epi-layers are not still visible in FIG. 12. It is understood that conductive contacts for the gate electrodes 570-573 and the source/drain epi-layers 410-412 and 430-433 may be formed by etching openings/recesses in the layers 600-603 and 620-623 and filling the etched openings/recesses with a conductive material, thereby providing electrical connectivity to the gate electrodes 570-573 and/or the source/drain epi-layers 410-412 and 430-433.

Figure 13:
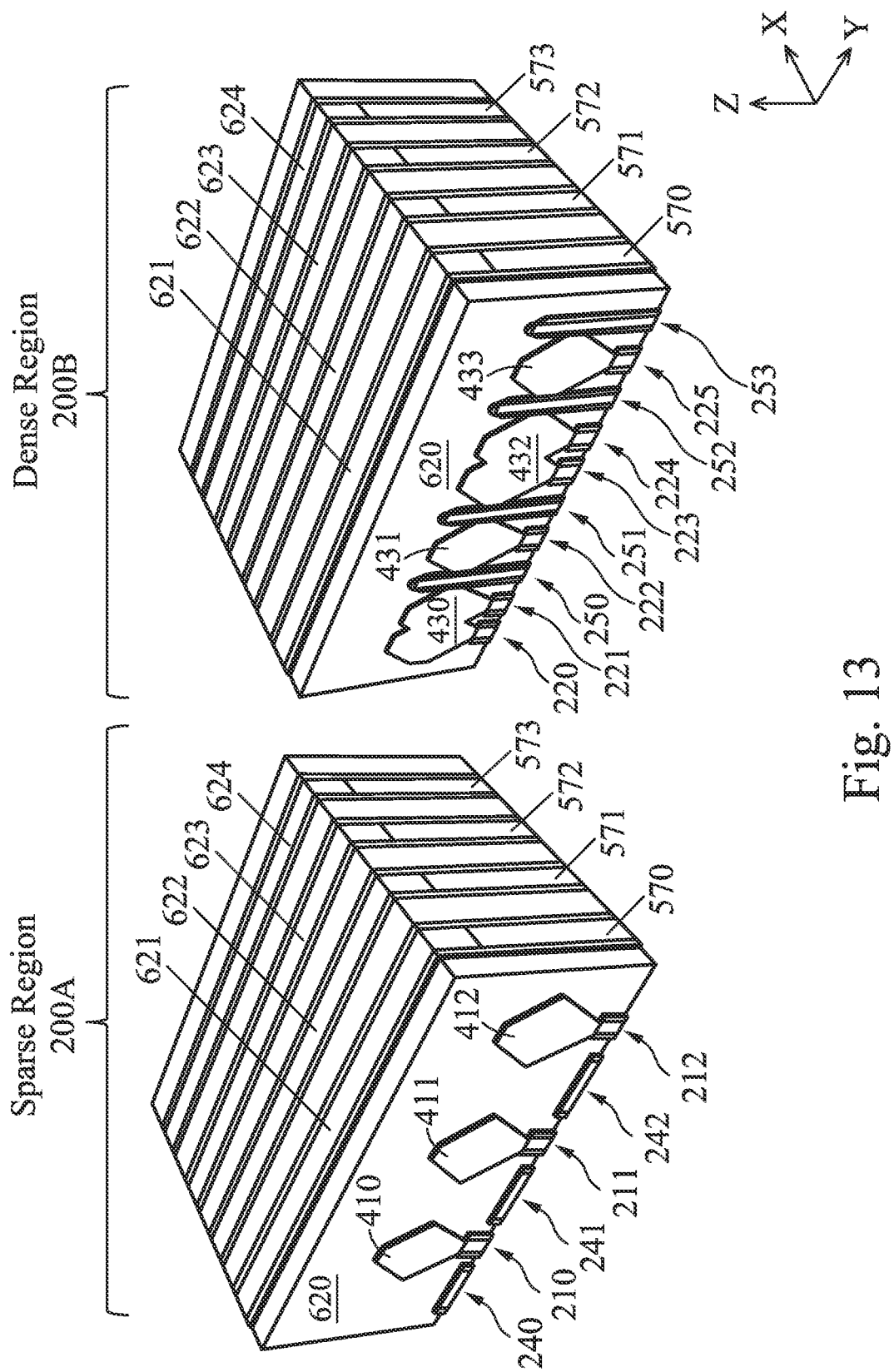
Figure 14:
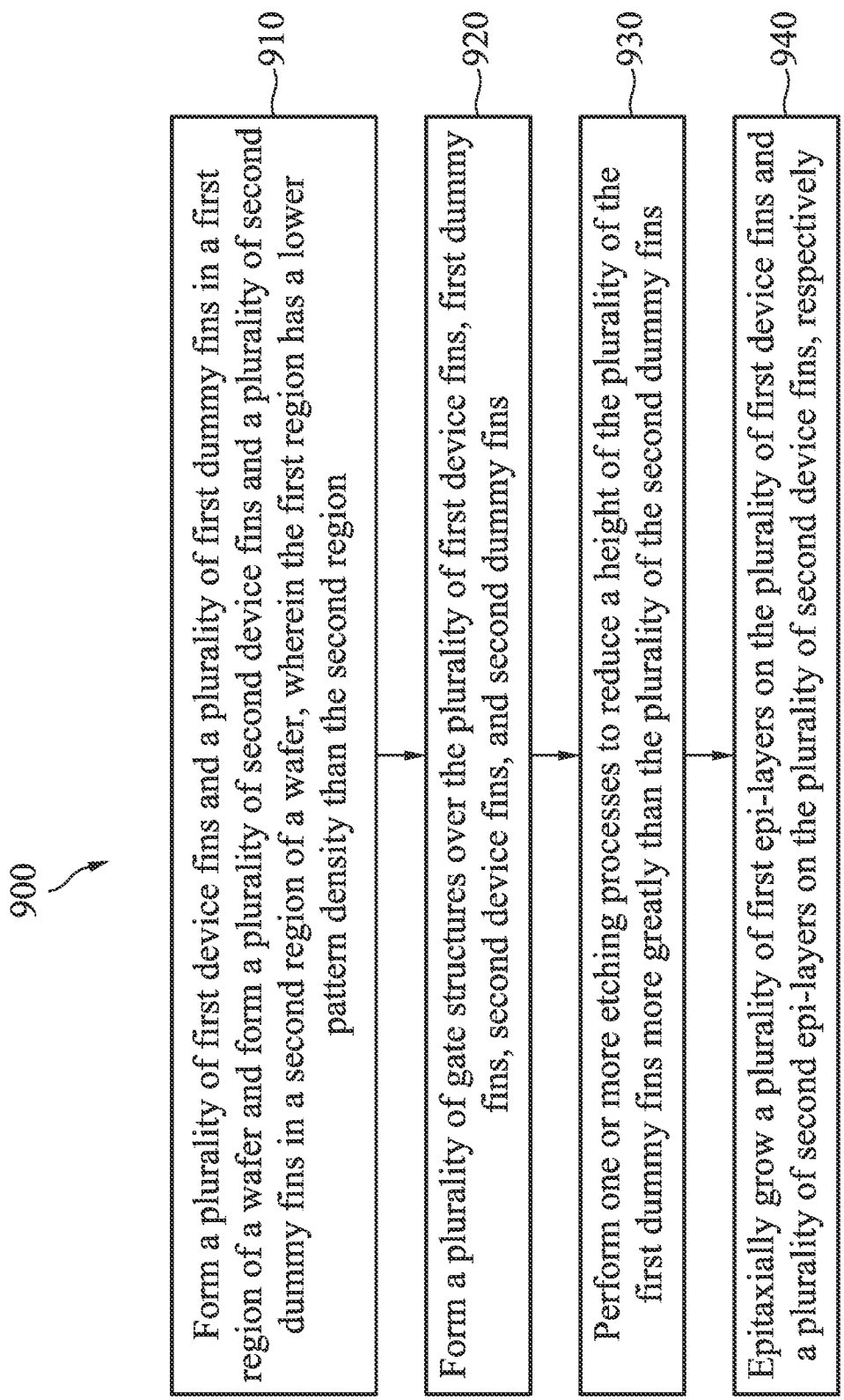
FIG. 14 is a flowchart illustrating a method of fabricating a semiconductor device according to an embodiment of the present disclosure.

Referring now to FIG. 13, the three-dimensional perspective views of the sparse region 200A and the dense region 200B are illustrated. The stage of fabrication in FIG. 13 is the same stage as FIG. 12. However, the Y-Z plane of the views in FIG. 13 are taken at a cross-section of the source/drain epi-layers 410-412 and 430-433, rather than at the cross-section of the metal gate electrode 570. Again FIG. 13 clearly illustrates the aspect of the present disclosure where the dummy fins 240-242 are reduced in height, so as to avoid constraining the lateral growth of the source/drain epi-layers 410-412 in the sparse region 200A. Meanwhile, the height reduction in the sparse region 200A does not substantially affect the height of the dummy funs 250-253 in the dense region 200B. Consequently, the dummy fins 250-253 can still prevent electrical bridging between the source/drain epi-layers 430-433 in the dense region 200B.

FIG. 14 is a flowchart illustrating a method 900 according to an embodiment of the present disclosure. The method 900 includes a step 910, in which a plurality of first device fins and a plurality of first dummy fins are formed in a first region of a wafer, and a plurality of second device fins and a plurality of second dummy fins are formed in a second region of a wafer. The first region has a lower pattern density than the second region.

In some embodiments, the plurality of first fins or second fins include a semiconductive material or a group III-V compound material, and the plurality of first dummy fins and second dummy fins include dielectric structures.

In some embodiments, the plurality of first device fins, second device fins, first dummy fins, and second dummy fins have substantially equal heights. In some embodiments, each of the first dummy fins is formed to have a substantially greater lateral dimension than each of the second dummy fins.

The method 900 includes a step 920, in which a plurality of gate structures is formed over the plurality of first device fins, first dummy fins, second device fins, and second dummy fins.

The method 900 includes a step 930, in which one or more etching processes are performed to reduce a height of the plurality of the first dummy fins more greatly than the plurality of the second dummy fins. In some embodiments, the step 930 includes performing a first etching process to reduce the height of both the plurality of first dummy fins and second dummy fins, and performing, after the first etching process has been performed, a second etching process to reduce the height of the plurality of first dummy fins but not the height of the plurality of second dummy fins.

The method 900 includes a step 940, in which a plurality of first epi-layers are epitaxially grown on the plurality of first device fins, and a plurality of second epi-layers are epitaxially grown on the plurality of second device fins, respectively. A lateral growth of the plurality of first epi-layers is substantially unimpeded by the plurality of the first dummy fins having a reduced height. The step 940 is performed after the step 930. In some embodiments, the epitaxial growth includes laterally growing the plurality of first epi-layers such that portions of the plurality of first epi-layers are grown above upper surfaces of the plurality of first dummy fins. In some embodiments, the epitaxial growth includes laterally growing the plurality of second epi-layers until the plurality of second epi-layers come into physical contact with the plurality of second dummy fins.

It is understood that additional processes may be performed before, during, or after the steps 910-940 of the method 900. For example, the method 900 may include a gate replacement process, in which the gate structures are dummy structures, and the dummy gate structures are replaced by metal-gate-electrode-containing gate structures. For reasons of simplicity, other additional steps are not discussed herein in detail.

In summary, the present disclosure forms dielectric structures such as dummy fins in FinFET fabrication. The dummy fins are formed in both a sparse region with relatively low pattern density and a dense region with relatively high pattern density. The pattern densities are catered to different types of devices. For example, the devices in the sparse region may include logic device and/or I/O devices where performance (e.g., speed, power, etc.) or process window (e.g., contact landing area) are more valued than having a high transistor density. In comparison, the devices in the dense region may include memory devices (e.g., SRAM) or other types of logic devices where a high transistor density may be valued over performance. According to embodiments of the present disclosure, the height of the dummy fins in the sparse region—but not the dense region—is reduced to avoid restricting lateral epitaxial growth of source/drain layers.

Based on the above discussions, it can be seen that the present disclosure offers advantages over conventional Fin-FET devices. It is understood, however, that other embodiments may offer additional advantages, and not all advantages are necessarily disclosed herein, and that no particular advantage is required for all embodiments. One advantage is that the height reduction of the dummy fins in the sparse region allows the source/drain epi-layers in the sparse region to not be otherwise constrained by the dummy fins. Bridging is unlikely to occur anywhere in the sparse region, since the device fins (and therefore the epi-layers grown thereon) are sufficiently spaced apart from one another. The full growth of the source/drain epi-layers in the sparse region optimizes parameters such as epi-stress, larger surface area for silicide formation, increased contact landing window, etc., thereby enhancing the performance of the devices in the sparse region. Another advantage is that electrical bridging is still prevented in the dense region, since the height reduction of the dummy fins does not apply to the dummy fins in the dense region. In this manner, the present disclosure simultaneously alleviates the concerns of devices in both the sparse region and the dense region. Other advantages include compatibility with existing FinFET fabrication, so the present disclosure does not require additional processing and is therefore easy and cheap to implement.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

One aspect of the present disclosure pertains to a semiconductor device. The semiconductor device includes a first device fin and a second device fin each located in a first region of the semiconductor device. The first region has a first pattern density. A first dummy fin is located in the first region. The first dummy fin is disposed between the first device fin and the second device fin. The first dummy fin has a first height. A third device fin and a fourth device fin are each located in a second region of the semiconductor device. The second region has a second pattern density that is greater the first pattern density. A second dummy fin is located in the second region. The second dummy fin is disposed between the third device fin and the fourth device fin. The second dummy fin has a second height that is greater than the first height.

Another aspect of the present disclosure pertains to a semiconductor device. The semiconductor device includes a plurality of first fin structures that each contain a first semiconductor material. A plurality of first source/drain epi-layers is formed on the plurality of first fin structures. A plurality of first dielectric structures is interspersed among the plurality of first fin structures. A plurality of second fin structures each contain a second semiconductor material. A plurality of second source/drain epi-layers are formed on the plurality of second fin structures. A plurality of second dielectric structures is interspersed among the plurality of second fin structures. The plurality of first fin structures, second fin structures, first dielectric structures, and second dielectric structures each protrudes vertically upward. A first distance between adjacent ones of the first fin structures is substantially greater than a second distance between adjacent ones of the second fin structures. Each of the first dielectric structures is substantially shorter but wider than each of the second dielectric structures. Portions of the first source/drain epi-layers are located above upper surfaces of the first dielectric structures. Portions of the second source/drain epi-layers are in physical contact with the second dielectric structures.

Yet another aspect of the present disclosure includes a method of fabricating a semiconductor device. A plurality of first device fins and a plurality of first dummy fins are formed in a first region of a substrate and forming a plurality of second device fins and a plurality of second dummy fins in a second region of a substrate. The first region has a lower pattern density than the second region. A plurality of gate structures is formed over the plurality of first device fins, first dummy fins, second device fins, and second dummy fins. One or more etching processes are performed to reduce a height of the plurality of the first dummy fins more greatly than the plurality of the second dummy fins. After the one or more etching processes have been performed, a plurality of first epi-layers are epitaxially grown on the plurality of first device fins and a plurality of second epi-layers on the plurality of second device fins, respectively. A lateral growth of the plurality of first epi-layers is substantially unimpeded by the plurality of the first dummy fins having a reduced height.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A method, comprising:
    forming a plurality of first device fins and a plurality of first dummy fins in a first region of a substrate and forming a plurality of second device fins and a plurality of second dummy fins in a second region of [[a]]the substrate, wherein the first region has a lower pattern density than the second region, and wherein the second dummy fins are spaced apart from the second device fins;

forming a plurality of gate structures over the plurality of first device fins, first dummy fins, second device fins, and second dummy fins;

performing one or more etching processes to reduce a height of the plurality of the first dummy fins more greatly than the plurality of the second dummy fins; and after the one or more etching processes have been performed, epitaxially growing a plurality of first epi-layers on the plurality of first device fins and a plurality of second epi-layers on the plurality of second device fins, respectively, wherein a lateral growth of the plurality of first epi-layers is substantially unimpeded by the plurality of the first dummy fins having a reduced height.

2. The method of claim 1, wherein the forming the plurality of first device fins and the plurality of first dummy fins and the forming the plurality of second device fins and the plurality of second dummy fins comprises:

forming a plurality of fins that includes a semiconductive material as the plurality of first device fins and second device fins; and forming a plurality of dielectric structures as the plurality of first dummy fins and the plurality of second dummy fins.

3. The method of claim 1, wherein the forming the plurality of first device fins and the plurality of first dummy fins and the forming the plurality of second device fins and the plurality of second dummy fins is performed such that the plurality of first device fins, second device fins, first dummy fins, and second dummy fins have substantially equal heights.

4. The method of claim 3, wherein each of the first dummy fins is formed to have a substantially greater lateral dimension than each of the second dummy fins.

5. The method of claim 1, wherein the performing the one or more etching processes comprises:

performing a first etching process to reduce the height of both the plurality of first dummy fins and second dummy fins; and performing, after the first etching process has been performed, a second etching process to reduce the height of the plurality of first dummy fins but not the height of the plurality of second dummy fins.

6. The method of claim 1, wherein the epitaxially growing comprises laterally growing the plurality of first epi-layers such that portions of the plurality of first epi-layers are grown above upper surfaces of the plurality of first dummy fins.

7. The method of claim 1, wherein the epitaxially growing comprises laterally growing the plurality of second epi-layers until the plurality of second epi-layers come into physical contact with the plurality of second dummy fins.

8. The method of claim 1, wherein the forming the plurality of gate structures comprises forming a plurality of dummy gate structures, and further comprising: replacing the plurality of dummy gate structures with a plurality of metal-gate-electrode-containing gate structures.

9. A method, comprising:

forming a plurality of first fin structures and a plurality of second fin structures in a first region of a substrate and forming a plurality of third fin structures and a plurality of fourth fin structures in a second region of [[a]]the substrate different from the first region, wherein the third fin structures are spaced apart from the fourth fin structures; and forming a plurality of gate structures over the plurality of first fin structures, second fin structures, third fin structures, and fourth fin structures;

etching the second fin structures and the fourth fin structures, wherein the second fin structures are etched more than the fourth fin structures;

forming, after the etching, a plurality of first source/drain layers on the plurality of first fin structures and a plurality of second source/drain layers on the plurality of third fin structures, respectively, wherein at least some portions of the first source/drain layers protrude over the second fin structures.

10. The method of claim 9, wherein the first region and the second region have different structures per unit-area.

11. The method of claim 9, wherein:

the first fin structures and third fin structures are formed as semiconductor-containing structures; and the second fin structures and the fourth fin structures are formed as dielectric-containing structures.

12. The method of claim 9, wherein the first fin structures, second fin structures, third fin structures, and fourth fin structures have substantially equal heights before the gate structures are formed.

13. The method of claim 9, wherein the second fin structures are each formed to be wider than each of the fourth fin structures.

14. The method of claim 9, wherein the etching comprises a two-step etching process, wherein a first step of the two-step etching process etches both the second fin structures and the fourth fin structures, and wherein a second step of the two-step etching process etches the second fin structures but not the fourth fin structures.

15. The method of claim 9, wherein the first source/drain layers and the second source/drain layers are formed using an epitaxial growth process.

16. The method of claim 9, wherein the second source/drain layers are formed to have direct physical contact with side surfaces of the fourth fin structures.

17. The method of claim 9, wherein the forming the plurality of gate structures comprises forming a plurality of dummy gate structures, and further comprising: replacing the plurality of dummy gate structures with a plurality of metal-gate-electrode-containing gate structures.

18. A method, comprising:

forming a plurality of first semiconductive structures and a plurality of first dielectric structures in a first region of a wafer and forming a plurality of second semiconductive structures and a plurality of second dielectric structures in a second region of the wafer different from the first region, wherein the first semiconductive structures, first dielectric structures, second semiconductive structures, and second dielectric structures each protrude vertically upwards, and wherein the second dielectric structures are spaced apart from the second semiconductive structures;

forming a plurality of gate structures over the first semiconductive structures, first dielectric structures, second semiconductive structures, and second dielectric structures;

reducing heights of the first dielectric structures more than the second dielectric structures; and epitaxially growing, after the reducing of the heights, a plurality of first source/drain layers on the plurality of first semiconductive structures and a plurality of second source/drain layers on the plurality of second semiconductive structures, respectively, wherein a lateral growth of the first source/drain layers is unaffected by the first dielectric structures, while a lateral growth of the second source/drain layers is stopped by the second dielectric structures.

19. The method of claim 18, wherein a number of first semiconductive structure located in the first region on a per-unit area basis is less than a number of second semiconductive structure located in the second region on a per-unit area basis.

20. The method of claim 18, wherein the reducing the heights comprises:
  performing a first etching process to reduce the heights of both the first dielectric structures and the second dielectric structures; and
  performing a second etching process to reduce the heights of the first dielectric structures but not the heights of the second dielectric structures.

* * * * *